(12) United States Patent
Yang et al.

(10) Patent No.: US 11,506,986 B2
(45) Date of Patent: Nov. 22, 2022

(54) THERMAL CONTROLLING METHOD IN LITHOGRAPHY SYSTEM

(71) Applicant: TAIWAN SEMICONDUCTOR MANUFACTURING CO., LTD., Hsinchu (TW)

(72) Inventors: Chi Yang, Tainan (TW); Yen-Shuo Su, Hsinchu (TW); Jui-Pin Wu, Hsinchu (TW); Li-Jui Chen, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 2 days.

(21) Appl. No.: 16/845,006

(22) Filed: Apr. 9, 2020

(65) Prior Publication Data

US 2021/0318625 A1    Oct. 14, 2021

(51) Int. Cl.
  *G03F 7/20* (2006.01)
  *H05G 2/00* (2006.01)
(52) U.S. Cl.
  CPC ...... *G03F 7/70891* (2013.01); *G03F 7/70033* (2013.01); *G03F 7/7055* (2013.01); *G03F 7/7085* (2013.01); *G03F 7/70166* (2013.01); *G03F 7/70591* (2013.01); *H05G 2/005* (2013.01); *H05G 2/008* (2013.01)
(58) Field of Classification Search
  CPC ............ G03F 7/70033; G03F 7/70166; G03F 7/7055; G03F 7/70591; G03F 7/7085; G03F 7/70875; G03F 7/70891; H05G 2/001–008; G02B 7/1815; G02B 7/182

USPC ................ 355/30, 67, 68, 77; 359/359, 845; 372/34–35

See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |

(Continued)

FOREIGN PATENT DOCUMENTS

WO    WO-2019146064 A1 *  8/2019  ............ B82Y 10/00

*Primary Examiner* — Christina A Riddle
(74) *Attorney, Agent, or Firm* — Maschoff Brennan

(57) ABSTRACT

In accordance with some embodiments, a lithography method in semiconductor manufacturing is provided. The lithography method includes transmitting a main pulse laser to a zone of excitation through a first optic assembly. The lithography method further includes supplying a coolant to the first optic assembly and detecting a temperature of the coolant with a use of at least one sensor. The lithography method also includes adjusting a heat transfer rate between the coolant and the first optic assembly based on the temperature of the first optic assembly. In addition, the lithography method includes generating a droplet of a target material into the zone of excitation. The lithography method further includes exciting the droplet of the target material into plasma with the main pulse laser in the zone of excitation.

20 Claims, 9 Drawing Sheets

(56) References Cited

U.S. PATENT DOCUMENTS

| | | | | |
|---|---|---|---|---|
| 2003/0179377 | A1* | 9/2003 | Masaki | G03F 7/70891 |
| | | | | 356/400 |
| 2010/0078577 | A1* | 4/2010 | Moriya | H01S 3/10 |
| | | | | 250/504 R |
| 2012/0248343 | A1* | 10/2012 | Nagai | H05G 2/003 |
| | | | | 250/504 R |
| 2012/0305809 | A1* | 12/2012 | Moriya | H05G 2/008 |
| | | | | 250/504 R |
| 2014/0246187 | A1* | 9/2014 | Kawasuji | F28F 27/02 |
| | | | | 165/301 |
| 2018/0031979 | A1* | 2/2018 | Bleeker | G02B 27/141 |
| 2020/0301285 | A1* | 9/2020 | Nagai | G03F 7/70033 |

* cited by examiner

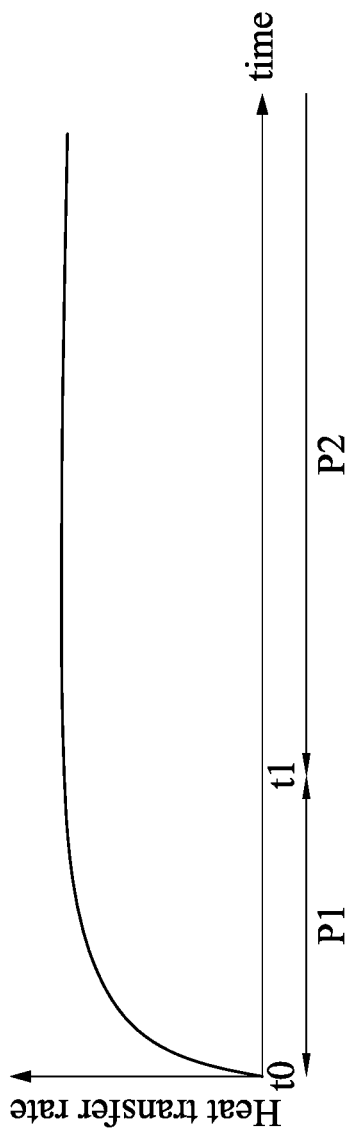
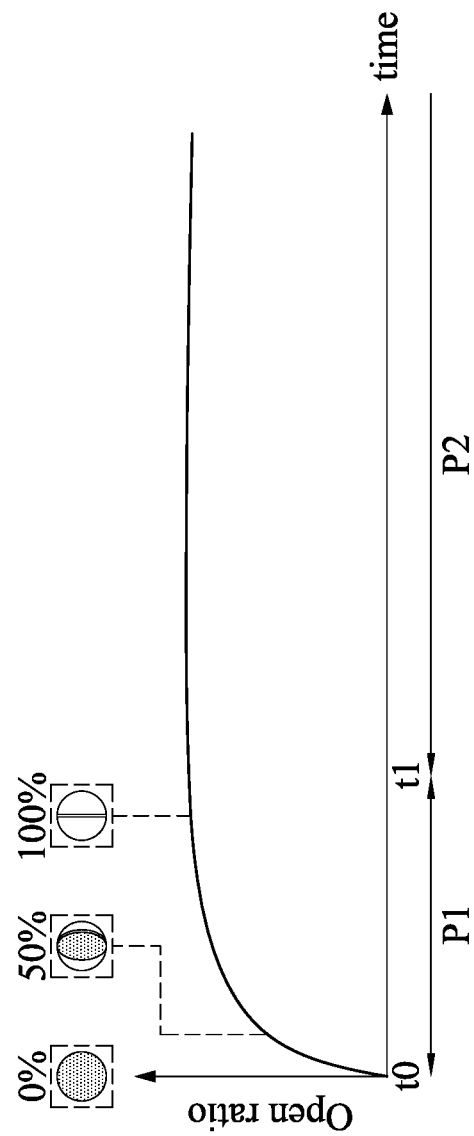
Fig. 7
Fig. 8

THERMAL CONTROLLING METHOD IN LITHOGRAPHY SYSTEM

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

For example, there is a growing need to perform higher-resolution lithography processes. One lithography technique is extreme ultraviolet lithography (EUVL). The EUVL employs scanners using light in the extreme ultraviolet (EUV) region, having a wavelength of about 1 nm to about 100 nm. Some EUV scanners provide a projection printing, similar to some optical scanners, except that the EUV scanners use reflective rather than refractive optics, i.e., mirrors instead of lenses. One type of EUV light source is laser-produced plasma (LPP). LPP technology produces EUV light by focusing a high-power laser beam onto small fuel droplet targets to form highly ionized plasma that emits EUV light with a peak of maximum emission at 13.5 nm. The EUV light is then collected by a collector and reflected by optics towards a lithography exposure object, e.g., a wafer. Although existing methods and devices for generating EUV light have been adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a diagram plotting a relationship of a heat transfer rate in an optic assembly versus an operating time of a lithography system, in accordance with some embodiments of the present disclosure.

FIG. 8 is a diagram plotting a relationship of an open ratio of a valve for controlling a coolant into an optic assembly versus an operating time of a lithography system, in accordance with some embodiments of the present disclosure.

DETAILED DESCRIPTION

Figure 1:
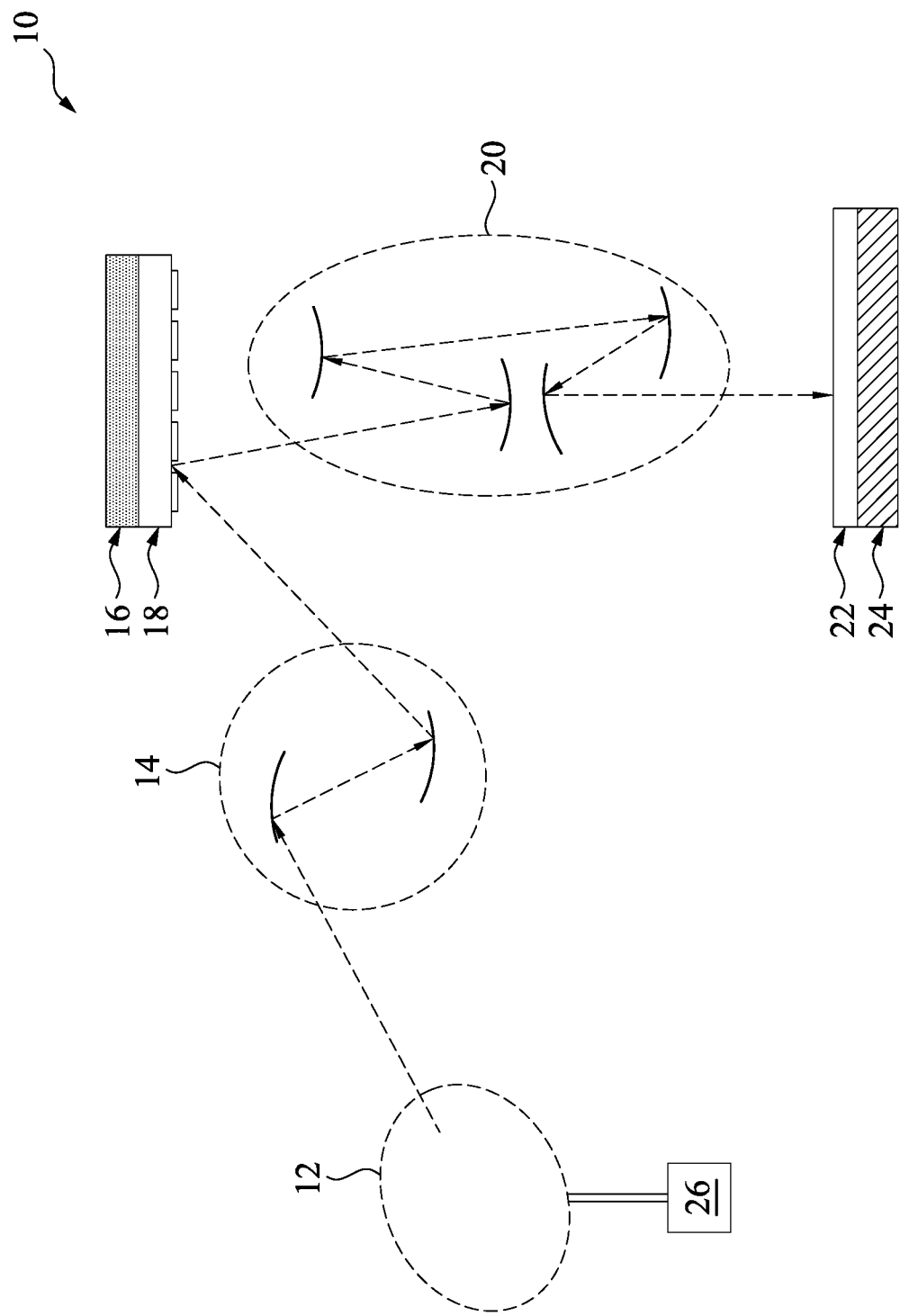
FIG. 1 shows a schematic view of a lithography system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first projection over or on a second projection in the description that follows may include embodiments in which the first and second projections are formed in direct contact, and may also include embodiments in which additional features may be formed between the first and second projections, such that the first and second projections may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a laser generator which emits laser with higher accuracy and thereby improving EUV plasma quality with minimum debris contamination on an EUV collector.

In one embodiment of current disclosure, two nano-seconds pulse lasers are used to irradiate target droplets, such as tin droplets, to deform the target droplets into pancake and ignite plasma in an EUV lithography system. The former is called pre-pulse (PP) laser and the latter one is called main pulse (MP) laser. The PP laser and the MP laser are transmitted to a zone of excitation through a beam transport module. Before the PP laser and the MP laser are transmitted to the beam transport module, the PP laser and MP laser are co-linear. The PP laser and MP laser are separated by optic assemblies in the beam transport module to heat droplets in different positions in the zone of excitation. However, heat load may be produced in a mirror and a mount frame for supporting the mirror of the optic assemblies due to high power (21-40 kW) lasers. The heat load will adversely affect the transmitting path of the PP laser and MP laser and causes a decrease in the conversion efficiency and EUV stability.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

To address the above issue, a cooling module is used to regulate the temperature of the optic assemblies in beam transport module, in accordance with one embodiment of the present disclosure. The cooling module detects real time data in relation to a temperature of the coolant and determines a heat transfer rate between a coolant and the optic assembly so as to properly control the temperature of the optic assemblies so as to permit the PP laser and MP laser to correctly hit the droplets.

FIG. 1 is a schematic and diagrammatic view of a lithography system 10, in accordance with some embodiments. The lithography system 10 may also be generically referred to as a scanner that is operable to perform lithography exposing processes with respective radiation source and exposure mode. The lithography system 10 includes a light source 12, an illuminator 14, a reticle stage 16, a projection optics module (or projection optics box (POB)) 20 and a substrate stage 24, in accordance with some embodiments. The elements of the lithography system 10 can be added to or omitted, and the invention should not be limited by the embodiment.

The light source 12 is configured to generate radians having a wavelength ranging between about 1 nm and about 100 nm. In one particular example, the light source 12 generates an EUV (extreme ultraviolet) light with a wavelength of about 1 nm to about 100 nm and centered at about 13.5 nm. Accordingly, the light source 12 is also referred to as an EUV light source. However, it should be appreciated that the light source 12 should not be limited to emitting EUV light. The light source 12 can be utilized to perform any high-intensity photon emission from excited target material.

In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the light source 12 onto the reticle stage 16, particularly to a reticle 18 secured on the reticle stage 16. In the present embodiment where the light source 12 generates light in the EUV wavelength range, reflective optics is employed.

The reticle stage 16 is configured to secure the reticle 18. In some embodiments, the reticle stage 16 includes an electrostatic chuck (e-chuck) to secure the reticle 18. This is because the gas molecules absorb EUV light and the lithography system for the EUV lithography patterning is maintained in a vacuum environment to avoid EUV intensity loss. In the present disclosure, the terms mask, photomask, and reticle are used interchangeably. The reticle 18 secured on the reticle stage 16 may be covered by a pellicle (not shown in figure) for mitigate particle issue.

In the present embodiment, the reticle 18 is a reflective mask. One exemplary structure of the reticle 18 includes a substrate with a suitable material, such as a low thermal expansion material (LTEM) or fused quartz. In various examples, the LTEM includes $TiO_2$ doped $SiO_2$, or other suitable materials with low thermal expansion. The reticle 18 includes reflective multilayer deposited on the substrate. The reflective multilayer includes a plurality of film pairs, such as molybdenum-silicon (Mo/Si) film pairs (e.g., a layer of molybdenum above or below a layer of silicon in each film pair). Alternatively, the reflective multilayer may include molybdenum-beryllium (Mo/Be) film pairs, or other suitable materials that are configurable to highly reflect the EUV light. The reticle 18 may further include a capping layer, such as ruthenium (Ru), disposed on the reflective multilayer for protection. The reticle 18 further includes an absorption layer, such as a tantalum boron nitride (TaBN) layer, deposited over the reflective multilayer. The absorption layer is patterned to define a layer of an integrated circuit (IC). Alternatively, another reflective layer may be deposited over the reflective multilayer and is patterned to define a layer of an integrated circuit, thereby forming an EUV phase shift mask.

The projection optics module (or projection optics box (POB)) 20 is configured for imaging the pattern of the reticle 18 on to a semiconductor wafer 22 secured on the substrate stage 24 of the lithography system 10. In some embodiments, the POB 20 has refractive optics (such as for a UV lithography system) or alternatively reflective optics (such as for an EUV lithography system) in various embodiments. The light directed from the reticle 18, carrying the image of the pattern defined on the reticle, is collected by the POB 20. The illuminator 14 and the POB 20 are collectively referred to as an optical module of the lithography system 10.

Figure 2:
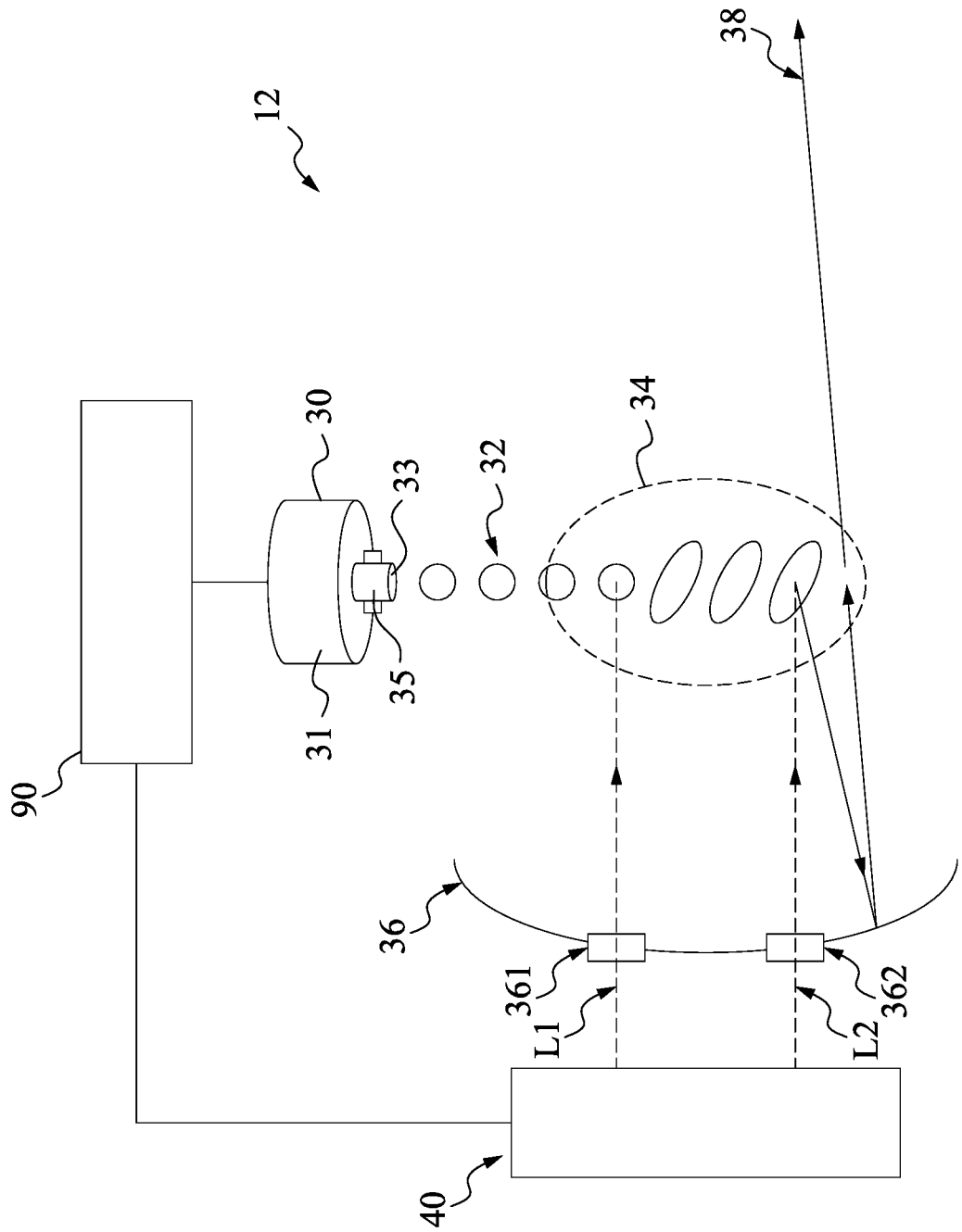
FIG. 2 shows a schematic view of partial elements in a lithography system, in accordance with some embodiments of the present disclosure.

The lithography system 10 may further include a number of actuators (not shown in the figures) connected to the illuminator 14 and the POB 20 to adjust the position of optic elements of the illuminator 14 and the POB 20. The actuators may be electrically connected to the controller module 90 (FIG. 2). In addition, the actuator is controlled to drive the movement of the optic elements of the illuminator 14 and the POB 20 according the signals issued by the controller module. As a result, the focal length of the light scanned over the semiconductor wafer 22 can be adjusted.

In the present embodiment, the semiconductor wafer 22 may be made of silicon or other semiconductor materials. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor wafer 22 is coated with a resist layer sensitive to the EUV light in the present embodiment. Various components including those described above are integrated together and are operable to perform lithography exposing processes.

The lithography system 10 may further include other modules or be integrated with (or be coupled with) other modules. In the present embodiment, the lithography system 10 includes a gas supply module 26 designed to provide hydrogen gas to the light source 12. The hydrogen gas helps reduce contamination in the light source 12.

FIG. 2 illustrates the light source 12 in a diagrammatical view, in accordance with some embodiments. The light source 12 employs a dual-pulse laser produced plasma (LPP) mechanism to generate plasma and further generate EUV light from the plasma. In some embodiments, the light source 12 includes, a droplet generator 30, an EUV collector mirror 36, a laser generator 40, and a monitoring device 70 and a controller module 90. The above-mentioned elements of the light source 12 may be held under vacuum.

The droplet generator 30 is configured to generate a plurality of droplets 32 of target material. In some embodiments, the droplet generator 30 includes a vessel 31, a nozzle 33 and an actuator 35. The nozzle 33 is connected to the vessel 31 for dispensing the droplets 32, and the actuator 35 surrounds the nozzle 33. The actuator 35, for example, includes a piezoelectric material. The actuator 35 applies a force on the nozzle 33 in response to control signal from the controller module 90 so as to supply the droplets 32 with a predetermined mode. For example, the controller module 90 supplies a voltage to the actuator 35 at a given frequency, causing the actuator 35 to press the nozzle 33 at the time of receiving the voltage and stop the pressing when no voltage is received. As a result, the nozzle 33 may supply a plurality of droplets 32 in the form of micro-droplets into the zone of excitation 34. In some other embodiments, a droplet pitch between two neighboring droplets 32 and/or the diameter of the droplets 32 are controlled as a function of the frequency at which the voltage is supplied to the actuator 35.

In an embodiment, the droplets 32 are tin (Sn) droplets. In an embodiment, the droplets 32 each have a diameter about 30 microns (μm). In an embodiment, the droplets 32 are generated at a rate about 50 kilohertz (kHz) and are introduced into a zone of excitation 34 in the light source 12 at a speed about 70 meters per second (m/s). Other material can also be used for the droplets 32, for example, a tin containing liquid material such as eutectic alloy containing tin, lithium (Li), and xenon (Xe). The droplets 32 may be in a solid or liquid phase.

The laser generator 40 is configured to generate at least one laser to allow a conversion of the droplets 32 into plasma. In some embodiments, the laser generator 40 emits a pre-pulse laser L1 and a main pulse laser L2. The pre-pulse laser L1 is used to heat (or pre-heat) the droplets 32 to expand the droplets 32, which is subsequently irradiated by the main pulse laser L2, generating increased emission of EUV light 38. Functions and structural features of the laser generator 40 are described in details in the description relating to FIG. 4, in accordance with some embodiment of the present disclosure.

The EUV collector mirror 36 is designed with a proper coating material and shape to function as a mirror for EUV collection, reflection, and focusing. In some embodiments, the EUV collector mirror 36 is designed to have an ellipsoidal geometry. In some embodiments, the coating material of the EUV collector mirror 100 is similar to the reflective multilayer of the EUV mask. In some examples, the coating material of the EUV collector mirror 36 includes a ML (such as a plurality of Mo/Si film pairs) and may further include a capping layer (such as Ru) coated on the ML to substantially reflect the EUV light. In some embodiments, the EUV collector mirror 36 may further include windows 361 and 362 for allowing the pre-pulse laser L1 and the main pulse laser L2 from the laser generator 40 passing through the EUV collector mirror 36. The windows 361 and 362 adopt a suitable material substantially transparent to the respective laser beams.

Figure 3:
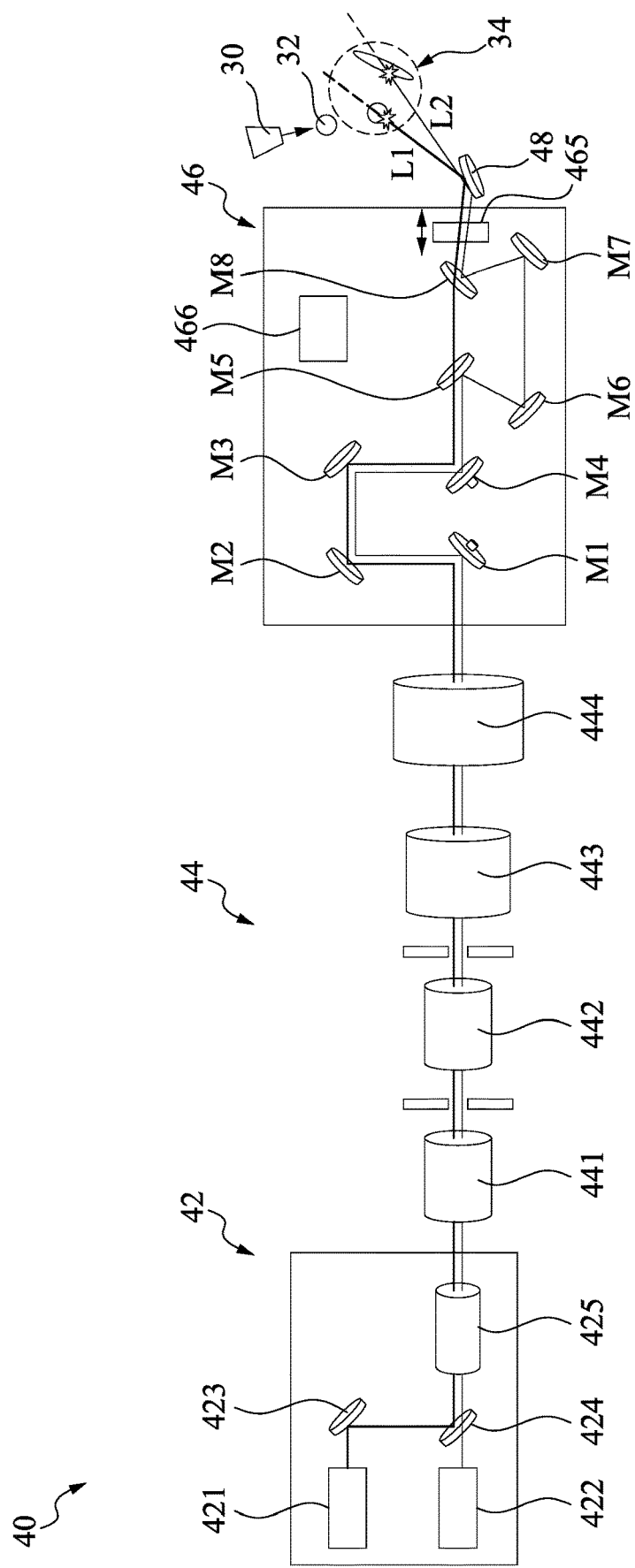
FIG. 3 shows a schematic view of partial elements in a lithography system, in accordance with some embodiments of the present disclosure.

FIG. 3 shows transmitting path of the pre-pulse laser L1 and the main pulse laser L2 in the laser generator 40 and positions where the pre-pulse laser L1 and the main pulse laser L2 irradiate droplets 32 from the droplet generator 30. In some embodiments, the laser generator 40 includes a seed table 42, a power amplifier module 44, a beam transport module 46, and a reflector 48.

The seed table 42 is configured to generate the pre-pulse laser L1 and the main pulse laser L2. In some embodiments, the seed table 42 includes a pre-pulse laser source 421, a main pulse laser source 422, a mirror 423, a beam splitter 424 and a pre-amplifier 425. The pre-pulse laser L1 is generated by the pre-pulse laser source 421, such as a laser oscillator. The output of the pre-pulse laser source 421 is provided to one or more pre-amplifiers 425 by way of one or more mirrors 423 and one or more beam splitters 424. The main pulse laser L2 is generated by the main pulse laser source 422, such as a laser oscillator. The output of the main pulse laser source 422 is also provided to the one or more pre-amplifiers 425. The pre-amplifiers 425 amplifies power of the pre-pulse laser L1 and/or the main pulse laser L2.

In an embodiment, the main pulse laser source 422 is a carbon dioxide ($CO_2$) laser source. In another embodiment, the main pulse laser source 422 is a neodymium-doped yttrium aluminum garnet (Nd:YAG) laser source. In an embodiment, the pre-pulse laser source 421 is a $CO_2$ laser source. In the particular example of FIG. 3, the wavelength of the pre-pulse laser L1 is different from that of the main pulse laser L2, where the one or more beam splitters 122 allow for the proper feeding of the pre-pulse laser L1 and the main pulse laser L2 to the one or more pre-amplifier 425.

In the present embodiment, the pre-pulse laser L1 has less intensity and a smaller spot size than the main pulse laser L2. In various embodiments, the pre-pulse laser L1 has a spot size of about 100 μm or less, and the main pulse laser L2 has a spot size about 200-300 μm, such as 225 μm. The pre-pulse laser L1 and the main pulse laser L2 are generated to have certain driving powers to fulfill wafer volume production, such as a throughput of 125 wafers per hour. For example, the pre-pulse laser L1 is equipped with about 2 kilowatts (kW) driving power, and the main pulse laser L2 is equipped with about 19 kW driving power. In various embodiments, the total driving power of the pre-pulse laser L1 and the main pulse laser L2, is at least 20 kW, such as 27 kW. However, it should be appreciated that many variations and modifications can be made to embodiments of the disclosure. Other structures and arrangements of one or more laser oscillators may be utilized to provide the pre-pulse laser L1 and the main pulse laser L2 to the droplets 32. For example, a single seed laser may be used in the generation of the pre-pulse laser L1 and the main pulse laser L2.

The pre-pulse laser L1 and the main pulse laser L2 generated by the pre-pulse laser source 421 and the main pulse laser source 422 are amplified by the power amplifier module 44. In some embodiments, the power amplifier module 44 includes the first to fourth power amplifiers 441, 442, 443, and 444 in some embodiments. Laser powers of the pre-pulse laser L1 and the main pulse laser L2 are enlarged by a consecutive power amplifiers 441, 442, 443, and 444, which may use RF power (13.56 MHz-Radio Frequency Generator) as an input.

The beam transport module 46 is configured to transport and focus the pre-pulse laser L1 and the main pulse laser L2 from the power amplifier module 44 to the droplets 32. In some embodiments, the beam transport module 46 includes a number of optic assemblies M1-M8. In some embodiments, the optic assemblies M5 and M8 include beam splitters and the remaining optic assemblies M1-M4, M6 and M7 include mirrors (e.g., reflectors). The two optic assemblies M5 and M8 allow the pre-pulse laser L1 to pass through the beam splitters toward the droplets 32. The combination of the optic assemblies M5-M8 reflects the main pulse laser L2 toward the droplets 32. The relative orientation of the optic assembly M7 to the optic assembly M8 steers the main pulse laser L2 in a direction different from that of the pre-pulse laser L1. One or both of the optic assemblies M6 and M7 may be curved so that the focus of the main pulse laser L2 is in a different focal plane than that of the pre-pulse laser L1 to take into account the displacement of the droplets 32 after hit by the pre-pulse laser L1. In some embodiments, the focal points of the pre-pulse laser L1 and the main pulse laser L2 are controlled by the optic assemblies M5-M8.

In some embodiments, the beam transport module 46 further includes a focusing assembly 465. The focusing assembly 465 may include a pair of concave and convex lens to shrink the beam size at focus points to zone of excitation 34 in a range from about 80 um to about 300 um for pre-pulse laser L1, and in a range from about 100 um to about 600 um for the main pulse laser L2, for example. The reflector 48 is used to direct the pre-pulse laser L1 and the main pulse laser L2 to the zone of excitation 34, after the pre-pulse laser L1 and the main pulse laser L2 leave the beam transport module 46.

In some embodiments, the beam transport module 46 also includes a final focus metrology (FFM) member 466. Fractional portions of the pre-pulse laser L1 and the main pulse laser L2 may be reflected to the FFM member 466 so that various metrology and diagnostic functions of the pre-pulse laser L1 and the main pulse laser L2 may be carried out. In some embodiments, the FFM member 466 includes a camera to monitor the pre-pulse laser L1 and the main pulse laser L2. Alternatively, the FFM member 466 includes a wavefront sensor to measure the intensity and phase at various points in a wavefront of the pre-pulse laser L1 and the main pulse laser L2. The FFM member 466 may be electrically connected to the controller module 90 (FIG. 2) to transmit the information in relation to the pre-pulse laser L1 and the main pulse laser L2 to the controller module 90.

In some embodiments, the optic assemblies M1 and M4 are moved by an actuator (not shown in figures) according to control signals from the controller module 90 so as to change the position (or focal plane) or pointing of the pre-pulse laser L1 in the zone of excitation 34. The optic assemblies M1 and M4 may be moved according to the information in relation to the pre-pulse laser L1 and the main pulse laser L2 collected by the FFM member 466. As a result, the position (or focal plane) or pointing of the pre-pulse laser L1 in the zone of excitation 34 can be compensated.

In some embodiments, no actuator exists to physically move the optic assemblies M5-M8, and therefore once the main pulse laser L2 leaves the optic assembly M5, the position (or focal plane) or pointing of the main pulse laser L2 cannot be compensated. In some embodiments, thermal loading is created in the optic assemblies M5-M8. The thermal loading may result in a mechanical deformation, and further leads to drifting of the position (or focal plane) or pointing of the main pulse laser L2 in micro-meter and micro-radian scales. To address the issue, embodiments of the present disclosure provides a cooling module 50, as shown in FIG. 4, to cool down the optic assemblies M5-M8.

Figure 4:
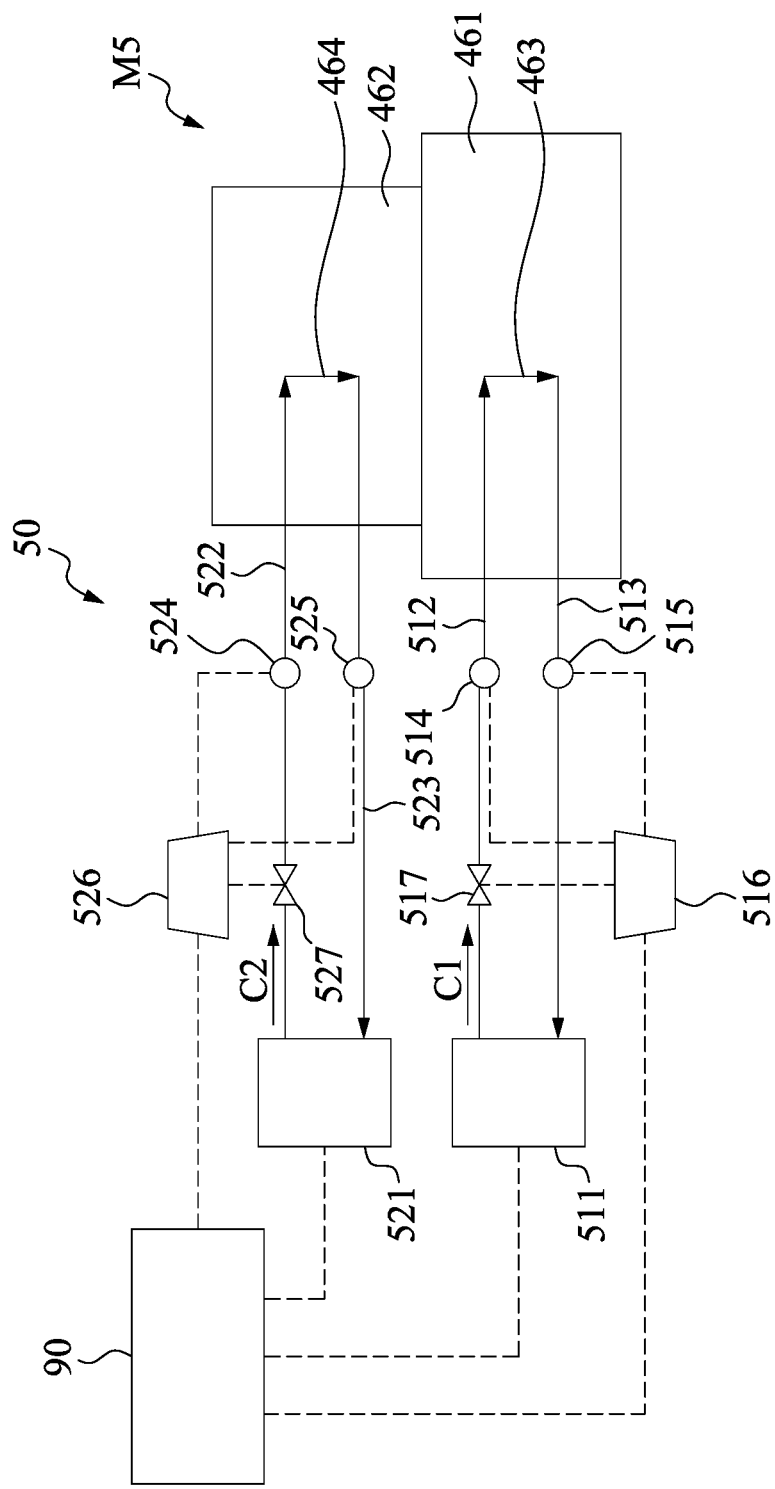
FIG. 4 shows a schematic view of partial elements in a lithography system, in accordance with some embodiments of the present disclosure.

FIG. 4 shows a schematic view of the optic assembly M5 and the cooling module 50, in accordance with some embodiments of the present disclosure. In some embodiments, the optic assembly M5 includes a mount frame 461 and a mirror 462. The mirror 462 is supported by the mount frame 461. The mirror 462 may be a reflector and made of material which is able to sustain high power laser beam, such as copper. The mount frame 461 may be made of material, such as aluminum, which has different thermal expansion ratio from that of the mirror 462.

The cooling module 50 is configured to cooling the optic assembly M5. It will be appreciated that while the embodiment shown in FIG. 4 using the optic assembly M5 as an example to explain how the cooling module 50 is operated to regulate temperature of the optic assembly M5, the cooling module 50 is not limited to connected to the optic assembly M5 and may be used to any optic assembly in the beam transport module 46. For example, the cooling module 50 is connected to the optic assembly M6 and is configured to cooling the optic assembly M6.

In some embodiments, the cooling module 50 includes two heat exchangers, such as heat exchanger 511 and heat exchanger 521. Each of the heat exchangers 511 and 521 may include a radiator coils (not show in figures). Fluid coolants, such as coolant C1 and coolant C2, flow through the radiator coils of the heat exchangers 511 and 521, and air flows pass the radiator coils, which cools the coolant and heats the incoming air. In some embodiments, the coolant C1 and the coolant C2 are cooling solutions mixing water and ion-exchange resin.

In some embodiments, the heat exchanger 511 is fluidly connected to the mount frame 461 through a number of conduits, such as inlet conduit 512 and outlet conduit 513. The inlet conduit 512 is used to guide coolant C1 to the mount frame 461, and the outlet conduit 513 is used to guide coolant C1 away from the mount frame 461. In some embodiments, a fluid channel 463 is connected to the mount frame 461. Two ends of the fluid channel 463 are connected to the inlet conduit 512 and the outlet conduit 513, such that the coolant C1 from the heat exchanger 511 sequentially flows through the inlet conduit 512, the fluid channel 463 and the outlet conduit 513 and circulated back to the heat exchanger 511. Therefore, heat from the mount frame 461 is dissipated by the coolant C1 passing through the fluid channel 463. In some embodiment, a valve 517 is connected to the inlet conduit 512 and is used to control the flow rate of the coolant C1 in the inlet conduit 512. The valve 517 may be a butterfly valve or a diaphragm valve or a gate type valve.

The fluid channel 463 may be embedded in the mount frame 461. Alternatively, the fluid channel 463 may be attached on an outer surface of the mount frame 461. In some embodiments, the fluid channel 463 has a helical tube configuration so as to increase an area of the fluid channel 463 that is in contact with the mount frame 461. However, it will be appreciated that many variations and modifications can be made to embodiments of the disclosure. The fluid channel 463 may be any other shape according to desired heat transfer design. In some embodiments, the fluid channel 463 is formed integrally with the inlet conduit 512 and the outlet conduit 513.

In some embodiments, the heat exchanger 521 is fluidly connected to the mirror 462 through a number of conduits, such as inlet conduit 522 and outlet conduit 523. The inlet conduit 522 is used to guide coolant C2 to the mirror 462, and the outlet conduit 523 is used to guide coolant C2 away from the mirror 462. In some embodiments, a fluid channel 464 is connected to the mirror 462. Two ends of the fluid channel 464 are connected to the inlet conduit 522 and the outlet conduit 523, such that the coolant C2 from the heat exchanger 521 sequentially flows through the inlet conduit 522, the fluid channel 464 and the outlet conduit 523 and circulated back to the heat exchanger 521. Therefore, heat from the mirror 462 is dissipated by the coolant C2 passing through the fluid channel 464. In some embodiment, a valve 527 is connected to the inlet conduit 522 and is used to control the flow rate of the coolant C2 in the inlet conduit 522. The valve 527 may be a butterfly valve or a diaphragm valve or a gate type valve.

The fluid channel 464 may be embedded in the mirror 462. Alternatively, the fluid channel 464 may be attached on an outer surface of the mirror 462. In some embodiments, the fluid channel 464 has a helical tube configuration so as to increase an area of the fluid channel 464 that is in contact with the mirror 462. However, it will be appreciated that many variations and modifications can be made to embodiments of the disclosure. The fluid channel 464 may be any other shape according to desired heat transfer design. In some embodiments, the fluid channel 464 is formed integrally with the inlet conduit 522 and the outlet conduit 523.

In some embodiments, at least one sensor is used to acquire data in relation to a temperature of the coolant supplied to the optic assembly 5. For example, sensor 514 and sensor 515 are respectively connected to the inlet conduit 512 and the outlet conduit 513. The sensor 514 and the sensor 515 may include thermal couples and configured to detect temperature of the coolant C1 passing through the inlet conduit 512 and the outlet conduit 513. The data in relation to the coolant C1 is sent to a processor 516 that is electrically connected to the sensor 514 and the sensor 515. The processor 516 calculates difference between the temperature of the coolant C1 in the inlet conduit 512 and temperature of the coolant C1 in the outlet conduit 513 and transfers data in relation to the difference to the controller module 90.

In addition to the sensor 514 and the sensor 515, sensor 524 and sensor 525 are respectively connected to the inlet conduit 522 and the outlet conduit 523. The sensor 524 and the sensor 525 may include thermal couples and configured to detect temperature of the coolant C2 passing through the inlet conduit 522 and the outlet conduit 523. The data in relation to the coolant C2 is sent to a processor 526 that is electrically connected to the sensor 524 and the sensor 525. The processor 526 calculates difference between the temperature of the coolant C2 in the inlet conduit 522 and temperature of the coolant C2 in the outlet conduit 523 and transfers data in relation to the difference to the controller module 90.

It will be noted that, the sensors 514, 515, 524 and 525 are not limited to detect temperature of the coolants C1 and C2 and can be used to detect other parameters of the coolants C1 and C2. For example, the sensor 514 can be used to detect flow rate of the coolant C1 in the inlet conduit 512, and the sensor 524 can be used to detect flow rate of the coolant C2 in the inlet conduit 522. The data in relation to the flow rate of the coolant can be transmitted to the processor 526, and a close loop control to the valves 517 and 527 can be performed by the controller module 90 according to the data in relation to the flow rate of the coolant.

Figure 5:
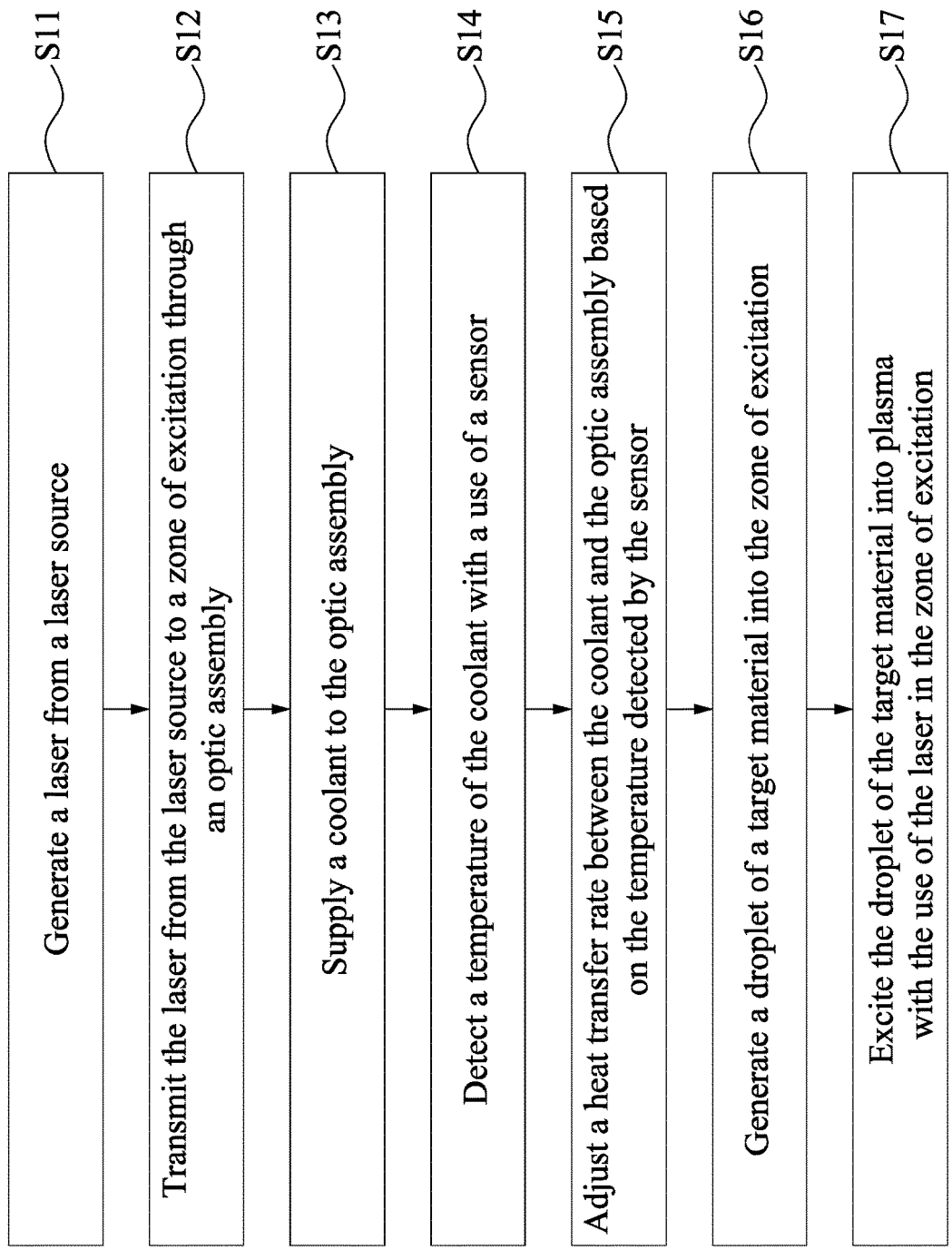
FIG. 5 shows a flow chart of a method for controlling temperature in a lithography system, in accordance with some embodiments of the present disclosure.

FIG. 5 is a flow chart of a method S10 for performing a lithography process in semiconductor fabrication, in accordance with some embodiments of the present disclosure. Although the method S10 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included. It will be appreciated that other figures are used as examples for the method, but the method is also applicable to other structures and/or configurations.

The method S10 includes operation S11, in which laser is generated by a laser source. In some embodiments, two lasers are generated by two different laser sources. As shown in FIG. 3, the pre-pulse laser L1 is generated by the pre-pulse laser source 421, and the main pulse laser L2 is generated by the main pulse laser source 422.

The method S10 also includes operation S12, in which the laser is transmitted from the laser source to the zone of excitation 34 through at least one mirror assembly. In the embodiment shown in FIG. 3, the pre-pulse laser L1 is transmitted from the pre-pulse laser source 421 to the zone of excitation 34 through the mirror assemblies M1-M4 and M8, and the main pulse laser L2 is transmitted from the main pulse laser source 422 to the zone of excitation 34 through the mirror assemblies M1-M8.

The method S10 also includes operation S13, in which coolant is supplied to the optic assembly. In some embodiments, as shown in FIG. 4, the coolant C1 is circulated through the mount frame 461 via the inlet conduit 512, the fluid channel 463 and the outlet conduit 513 and back to the heat exchanger 511, and the coolant C2 is circulated through the mirror 462 via the inlet conduit 522, the fluid channel 464 and the outlet conduit 523 and back to the heat exchanger 521. The flow rate of the coolant C1 is controlled by the valve 517, and the flow rate of the coolant C2 is controlled by the valve 527. Since the optic assembly M5 is cooled down by the coolant C1 and the coolant C2, temperature of the optic assembly M5 is regulated and thus a mechanical deformation can be mitigated or prevented.

The supply of the coolant C1 and the coolant C2 is initiated no matter whether the laser beams are generated or not. In some embodiment, the supply of the coolant C1 or the coolant C2 and the generation of the pre-pulse laser L1 and the main pulse laser L2 are initiated at the same time. In one exemplary embodiment, the supply of the coolant C1 and the coolant C2 allows all optic assemblies to be thermally equilibrium and having a warm up temperature (e.g., 21.8 degrees Celsius to 22.1 degrees Celsius) before the generation of the re-pulse laser L1 and the main pulse laser L2. In addition, the supply of the coolant C1 and the coolant C2 allows all optic assemblies to be thermally equilibrium and having a stable temperature (e.g., 22.1 degrees Celsius to 24 degrees Celsius) after 0.5-4 hours of the generation of the re-pulse laser L1 and the main pulse laser L2. The stable temperature is determined on the power of $CO_2$ laser.

The method S10 also includes operation S14, in which temperature of the coolant is detected with a use of at least one sensor. In some embodiments, as shown in FIG. 4, the temperature of the coolant C1 in the inlet conduit 512 is detected by the sensor 514, and temperature of the coolant C1 in the outlet conduit 513 is detected by the sensor 515. The temperature of the coolant C2 in the inlet conduit 522 is detected by the sensor 524, and temperature of the coolant C2 in the outlet conduit 523 is detected by the sensor 525. The sensors 514 and 515 outputs data in relation to the temperature of the coolant C1 to the processor 516, and the sensors 524 and 525 outputs data in relation to the temperature of the coolant C2 to the processor 526.

Figure 6A:
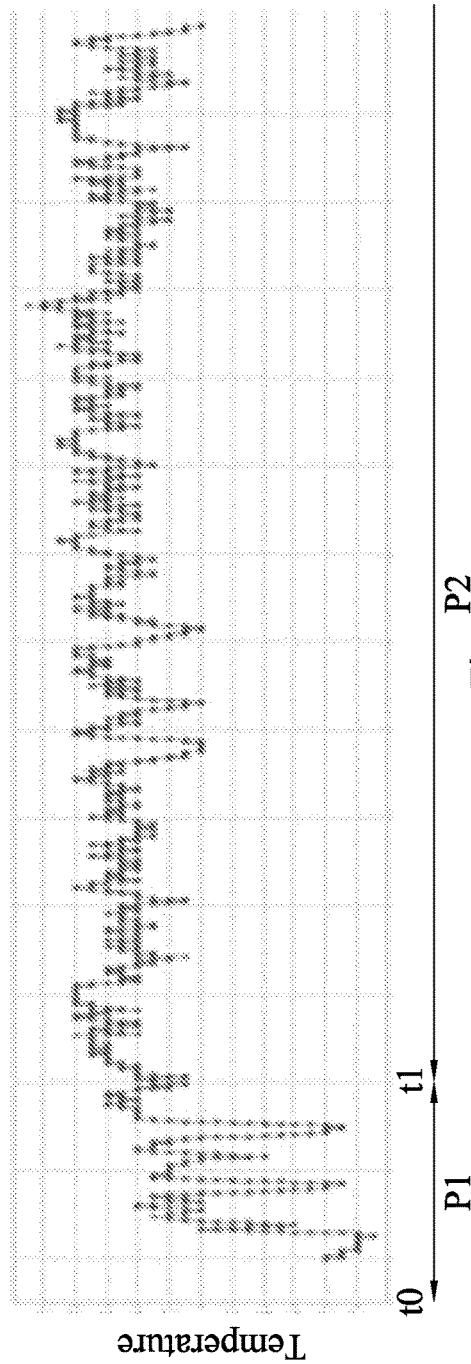
FIG. 6A is a diagram plotting a historical data in relation to a temperature of a mount frame of an optic assembly during a lithography process, in accordance with some embodiments of the present disclosure.
Figure 6B:
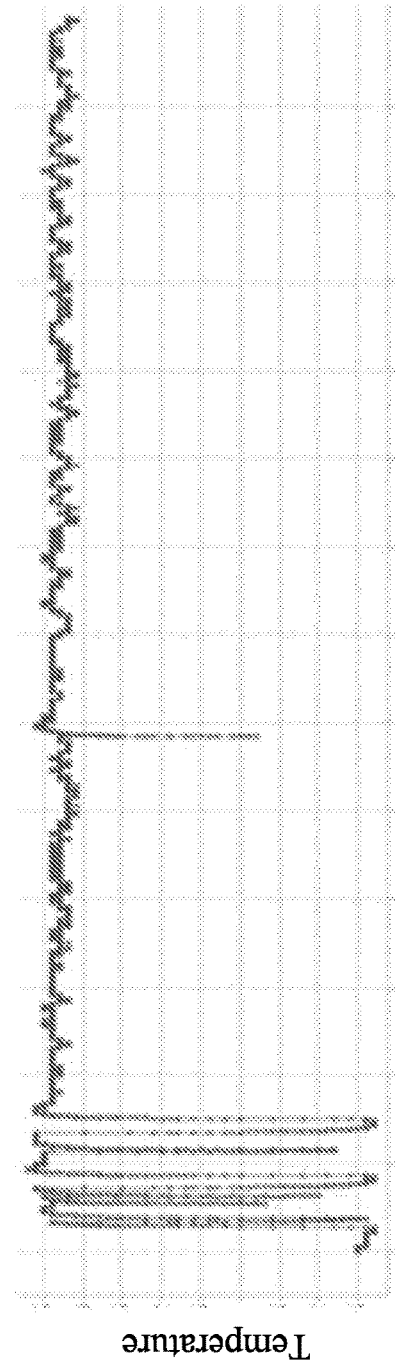
FIG. 6B is a diagram plotting a historical data in relation to a temperature of a mirror of an optic assembly during a lithography process, in accordance with some embodiments of the present disclosure.

The method S10 also includes operation S15, the heat transfer rate between the coolant and the optic assembly is adjusted based on the temperature detected by the sensor. In some embodiments, as shown in FIG. 6A, before the temperature of the optic assembly is stable, the temperature of the mount frame 461 is gradually increased because the heat transfer rate between the coolant C1 and the mount frame 461 is greater than an actually heat accumulated in the mount frame 461. Similar unstable situation occurs in the mirror 462, as shown in FIG. 6B. The unstable situation may lead to a mechanical deformation between the mount frame 461 and the mirror 462 and thereby increasing a drifting of the main pulse laser L2. To address this problem, the heat transfer rate between the coolant C1 and the mount frame 461 and the heat transfer rate between the coolant C2 and the mirror 462 are adjusted according to real time information, in accordance with some embodiments.

In some embodiments, the heat transfer rate between the coolant C1 and the mount frame 461 and between the coolant C2 and the mirror 462 satisfies with the equation $q=c_p*dT*m/t$, where q is mean heat transfer rate, $c_p$ is specific heat of the coolant, dT is change in fluid temperature, and m/t is mass flow rate of the coolant. In cases where the specific heat ($c_p$) of the coolant is known, the heat transfer rate is proportional to the mass flow rate of the coolant or proportional to the change in fluid temperature between the coolant in inlet conduit and the coolant in outlet conduit.

To regulate the temperature of the elements of the optic assembly, an acceptable heat transfer rate in different time may be determined in advance. In some embodiments, the acceptable heat transfer rate in different time may be determined by the actual temperature of the element (e.g., the mount frame 461) of the optic assembly. Alternatively, the acceptable heat transfer rate in different time may be determined according to a historical data which presents the temperature of the mount frame 461 in one or more previously conducted processes. In some embodiments, a lower heat transfer rate is employed before the temperature of the optical assembly is stable. That is, to cool the mount frame 461 with a lower temperature, a lower heat transfer rate is employed, and vice versa. One exemplary acceptable heat transfer rate for the mount frame 461 of the optic assembly M5 is plotted in FIG. 7.

In some embodiments, the $c_p$ and dT are known values, and therefore the acceptable heat transfer rate can be attained by controlling the flow rate of the coolant passing through the optic assembly. In some embodiments, the flow rate of the coolant C1 passing through the mount frame 461 of the optic assembly M5 is controlled by changing an open ratio of the valve 517. For example, as shown in FIG. 8, at the beginning of the process time (i.e., at time t0), the valve 517 is closed (open ratio is 0%), and the open ratio of the valve 517 is gradually increased to 50%, and the valve 517 is fully open (open ratio is 100%) at time t1. In the embodiment that a butterfly valve is used as the valve 517, open ratio 0% means that a disc of the valve is perpendicular to length direction of the inlet conduit 512, and open ratio 100% means that the disc of the valve is parallel to length direction of the inlet conduit 512, as shown in FIG. 8.

In some other embodiments, the valve 517 is partially open (e.g., open ratio is in a range from about 70% to about 90%) after time t1 (when the temperature of the mount frame 461 become stable) rather than fully open. The open ratio of the valve 517 after time t1 can be determined based on the acceptable heat transfer rate and the temperature of the coolant C1 acquired at time t1. That is, the open ratio of the valve 517 in the second period of time is determined based on the temperature of the coolant C1 detected in the end (i.e., at time t1) of the first period of time.

In some embodiments, the heat transfer rate of the coolant and the optic assembly is controlled based on historical data relating to the temperature of the optic assembly, and operation of detecting temperature of the coolant is omitted. For example, as shown in FIG. 6A, historical data relating to the temperature of the mount frame 461 become stable at time t1. To improve temperature stability (i.e., temperature of the mount fame 461 equaled to temperature of the optic mirror 462) before time t1, the open ratio of the valve gradually increases in a first period of time (from time t0 to time t1) and is fixed in a second period of time (after time t1). For example, as shown in FIG. 8, the open ratio of the valve 517 gradually increases from 0% to 100% in the first period of time (P1), and the open ratio of the valve 517 is kept in a fixed value (e.g., 100%) in the second period of time P2. The temperature of the mirror 462 can be controlled with a similar method according to the historical data relating to the temperature of the mirror shown in FIG. 6B. The first period of time is in a range from about 0.5 hours to about 4 hours.

In some embodiments, the heat transfer rate of the coolant and the optic assembly is adjusted by changing the temperature of the coolant C1 supplied to the optic assembly. For example, to increase the heat transfer rate of the coolant C1 and the mount frame 461, the coolant C1 may be chilled by the heat exchanger 511 to a lower temperature, and to decrease the heat transfer rate of the coolant C1 and the mount frame 461, the coolant C1 may be kept by the heat exchanger 511 to a higher temperature.

The method S10 also includes operation S15, in which droplets 32 of the target material are generated. In some embodiments, as shown in FIG. 2, the droplets 32 of the target material are generated by the droplet generator 30 and falls into the zone of excitation 34. In some embodiments, the droplets 32 are tin (Sn) droplets. In an embodiment, the droplets 32 each have a diameter about 30 microns (μm). In an embodiment, the droplets 32 are generated at a rate about 50 kilohertz (kHz) and are introduced into a zone of excitation 34 in the light source 12 at a speed about 70 meters per second (m/s). Other material can also be used for the droplets 32, for example, a tin containing liquid material such as eutectic alloy containing tin, lithium (Li), and xenon (Xe). The droplets 32 may be in a solid or liquid phase.

The method S10 also includes operation S16, in which the droplets 32 of the target material are excited with the use of the laser in the zone of excitation. In some embodiments, as shown in FIG. 2, the pre-pulse laser L1 and/or the main pulse laser L2 controlled by the beam transport module 46 hit droplets 32 generated by a droplet generator 30 to produce EUV radiation. The pre-pulse laser L1 deforms the droplets 32 into pancake, and the main pulse laser L2 excited the droplet into plasma which in turn emits EUV light to a scanner in the EUV lithography system.

Figure 9:
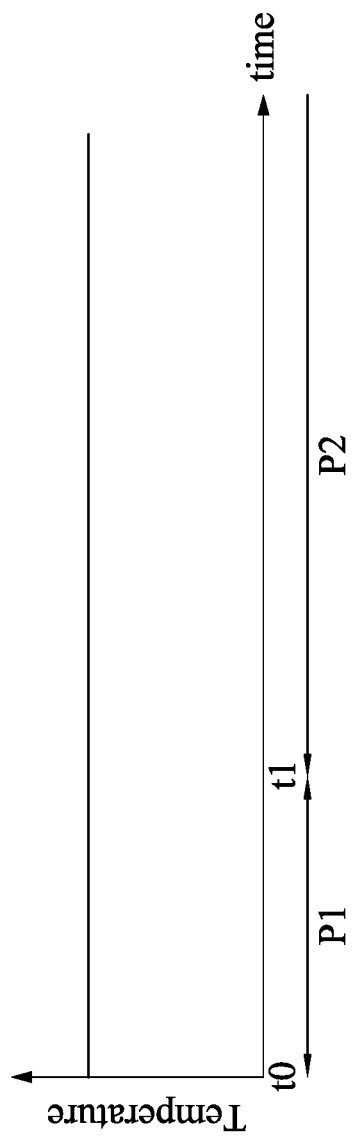
FIG. 9 is a diagram plotting a relationship of a temperature of an optic assembly versus operating time of a lithography system, in accordance with some embodiments of the present disclosure.

In some embodiments, since the heat transfer rate of the coolants C1 and C2 and the optic assembly M5 are controlled properly, the temperature of the optic assemblies can be controlled in a stable condition, as shown in FIG. 9, from the beginning of the lithography process. As a result, the concern that mechanical deformation between the mount frame 461 and the mirror 462 may occur due to different heat transfer rates is mitigated, and thus the drifting of the main pulse laser L2 is prevented, which means the droplets 32 can be hit by the main pulse laser L2 correctly (i.e., pre-pulse laser and main pulse laser (PP-MP) separation drift is minimized). As a result, debris accumulated on the EUV collector mirror 36 is reduced, and the reflectivity of the EUV collector mirror 36 is improved. In addition, an energy conversion efficiency is boosted and EUV light stability is improved. According to one simulation result, 3% of availability of the lithography system 10 is improved thank to the implementation of the method S10.

Figure 10:
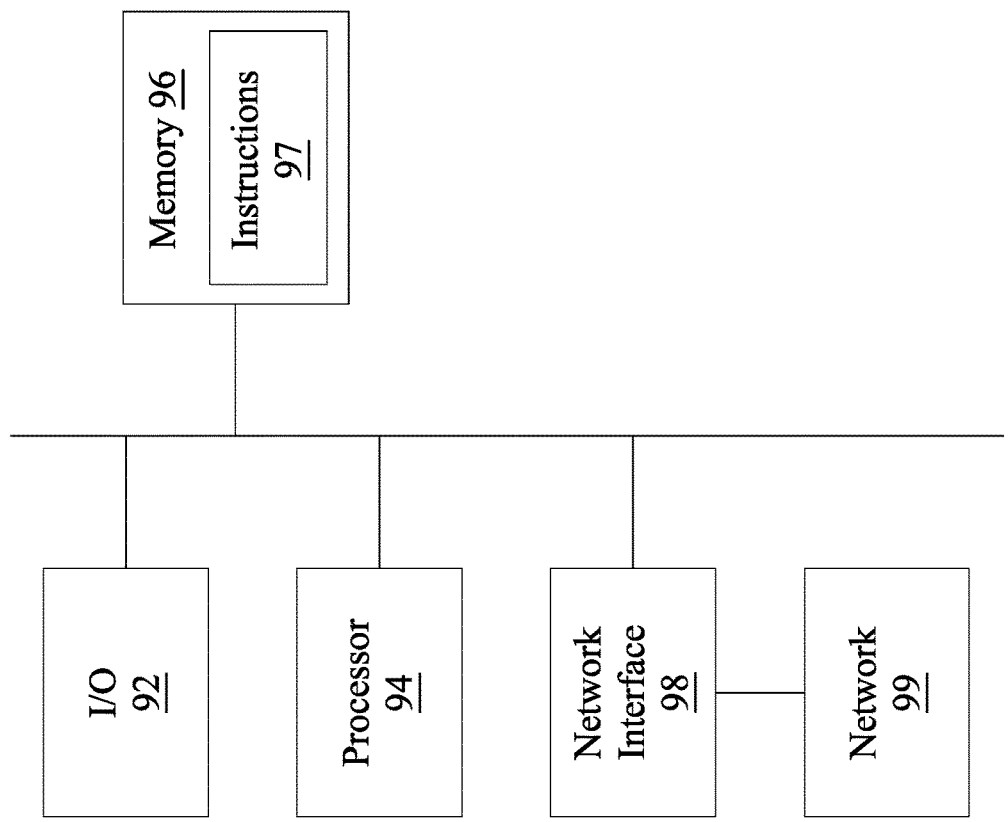
FIG. 10 shows a block diagram of a controller module, in accordance with some embodiments.

FIG. 10 shows a block diagram of a controller module, in accordance with some embodiments. The controller module 90 generates output control signals for controlling operations of the lithography system 10 and other components of lithography system 10, in accordance with some embodiments. In some embodiments, the controller module 90 includes a processor 94, an input/output (I/O) device 92, a memory 96, and a network interface 98 each communicatively coupled via an interconnection communication mechanism.

The processor 94 is arranged to execute and/or interpret one or more set of instructions 97 stored in the memory 96. In some embodiments, the processor 94 is a central processing unit (CPU), a multi-processor, a distributed processing system, an application specific integrated circuit (ASIC), and/or a suitable processing unit. The processor 94 may utilize the logic of proportional-integral-derivative (DIP) to determine the open ratio of the valve based on the data collected by the sensors mounted in the cooling module 50 or the optic assembly, such as the optic assembly M5.

The I/O device 92 is coupled to external circuitry. In some embodiments, the I/O device 92 includes a keyboard, keypad, mouse, trackball, trackpad, and/or cursor direction keys for communicating information and commands to the processor 94.

The memory 96 (also referred to as a computer-readable medium) includes a random access memory or other dynamic storage device, communicatively coupled to the bus for storing data and/or instructions for execution by the processor 94. In some embodiments, the memory 96 is used for storing temporary variables or other intermediate information during execution of instructions to be executed by the processor 94. In some embodiments, the memory 96 also includes a read-only memory or other static storage device coupled to the bus 610 for storing static information and instructions for the processor 94. In some embodiments, the memory 96 is an electronic, magnetic, optical, electromagnetic, infrared, and/or a semiconductor system (or apparatus or device). For example, the memory 96 includes a semiconductor or solid-state memory, a magnetic tape, a removable computer diskette, a random access memory (RAM), a read-only memory (ROM), a rigid magnetic disk, and/or an optical disk. In some embodiments using optical disks, the memory 96 includes a compact disk-read only memory (CD-ROM), a compact disk-read/write (CD-R/W), and/or a digital video disc (DVD). The memory 96 may store information in relation to the historical data of the optic assembly of the lithography system 10.

The memory 96 is encoded with, i.e., storing, the computer program code, i.e., a set of executable instructions 97, for controlling one or more components of the droplet generator 30 and the laser generator 40 to perform the method S10. In some embodiments, the memory 96 also stores information needed for performing the method S10 as well as information generated during performing the method S10.

The network interface 98 includes a mechanism for connecting to a network 99, to which one or more other computer systems are connected. In some embodiments, the network interface 98 includes a wired and/or wireless connection mechanism. The network interface 98 includes wireless network interfaces such as BLUETOOTH, WIFI, WIMAX, GPRS, or WCDMA; or wired network interface such as ETHERNET, USB, or IEEE-1394. In some embodiments, the controller module 90 is coupled with one or more components of the droplet generator 30 and the laser generator 40 via the network interface 98. In some embodiments, the controller module 90 is directly coupled with one or more components of the droplet generator 30 and the laser generator 40, e.g., with the components coupled to the bus instead of via the network interface 98.

In accordance with some embodiments, a lithography method in semiconductor manufacturing is provided. The lithography method includes transmitting a main pulse laser to a zone of excitation through a first optic assembly. The lithography method further includes supplying a coolant to the first optic assembly and detecting a temperature of the coolant with a use of at least one sensor. The lithography method also includes adjusting a heat transfer rate between the coolant and the first optic assembly based on the temperature of the first optic assembly. In addition, the lithography method includes generating a droplet of a target material into the zone of excitation. The lithography method further includes exciting the droplet of the target material into plasma with the main pulse laser in the zone of excitation. In some embodiments, the supplying the coolant to the first optic assembly is performed such that the coolant is sequentially guided passing through an inlet conduit, the first optic assembly and an outlet conduit. In some embodiments, the detecting the temperature of the coolant includes detecting a first temperature of the coolant in the inlet conduit; detecting a second temperature of the coolant in the outlet conduit; and calculating a difference between the first temperature and the second temperature, wherein the heat transfer rate between the coolant and the first optic assembly is adjusted based on the difference between the first temperature and the second temperature. In some embodiments, the adjusting the heat transfer rate between the coolant and the first optic assembly is performed by regulating a flow rate of the coolant in the first optic assembly. In some embodiments, the flow rate of the coolant is regulated by controlling an open ratio of a valve that is connected to a conduit for supplying the coolant to the first optic assembly. In some embodiments, the method further includes transmitting a pre-pulse laser to the zone of excitation through a second optic assembly; and hitting the droplet of the target material with the pre-pulse laser before its excitation by the main pulse laser. the main pulse laser and the pre-pulse laser are diverged at the second optic assembly, and the main pulse laser is reflected by the second optic assembly to the first optic assembly. In some embodiments, the coolant is supplied to a mount frame of the first optic assembly, and an optic of the first optic assembly for transmitting the main pulse laser is positioned on the mount frame. In some embodiments, the coolant is supplied to an optic of the first optic assembly that is used to transmit the main pulse laser. In some embodiments, the plasma emits an extreme ultraviolet light having a wavelength in a range from about 1 nm to about 100 nm.

In accordance with some embodiments, a lithography method in semiconductor manufacturing is provided. The lithography method includes transmitting a main pulse laser to a zone of excitation through a first optic assembly. The lithography method further includes supplying a coolant to the first optic assembly and controlling a flow rate of the coolant passing through the first optic assembly by adjusting an open ratio of a valve. The open ratio of the valve gradually increases in a first period of time and is fixed in a second period of time after the end of the first period of time. The lithography method also includes generating a droplet of a target material into the zone of excitation. In addition, the lithography method includes exciting the droplet of the target material into plasma with the main pulse laser in the zone of excitation. In some embodiments, the method further includes detecting a temperature of the coolant with a use of at least one sensor. An increasing rate of the open ratio of the valve in the first period of time is determined based on the temperature of the coolant. In some embodiments, the method further includes detecting a temperature of the coolant with a use of at least one sensor. The open ratio of the valve in the second period of time is determined based on the temperature of the coolant detected in the end of the first period of time. In some embodiments, the first period of time is in a range from about 0.5 hours to about 4 hours. In some embodiments, the end of the first period of time is set when an average temperature of the optic assembly reaches a predetermined value. In some embodiments, the method further includes transmitting a pre-pulse laser to the zone of excitation through a second optic assembly; and hitting the droplet of the target material with the pre-pulse laser before its excitation by the main pulse laser. The main pulse laser and the pre-pulse laser are diverged at the second optic assembly, and the main pulse laser is reflected by the second optic assembly to the first optic assembly. In some embodiments, the coolant is supplied to a mount frame of the first optic assembly, and an optic of the first optic assembly for transmitting the main pulse laser is positioned on the mount frame. In some embodiments, the coolant is supplied to an optic of the first optic assembly that is used to transmit the main pulse laser.

In accordance with some embodiments, a lithography system is provided. The lithography system includes a main pulse laser source and an optic assembly. The main pulse laser source is configured to generate a main pulse laser. The optic assembly is configured to transmit the main pulse laser to a zone of excitation. The lithography system further includes a coolant supplying module connected to the optic assembly and comprises a valve for controlling a flow rate of a coolant supplied into the optic assembly. The lithography system also includes at least one sensor configured to produce data in relation to a temperature of the coolant. In addition, the lithography system includes a controller module electrically connected to the valve and configured to control an open ratio of the valve based on the data in relation to the temperature of the coolant. The lithography system further includes a droplet generator configured to generate a droplet of target material to the zone of excitation. In some embodiments, the number of the sensors is plural, and the coolant supplying module includes an inlet conduit for supplying the coolant into the optic assembly; and an outlet conduit for guiding the coolant leaving the optic assembly. A first sensor is connected to the inlet conduit and a second sensor is connected to the outlet conduit, and the controller module controls the open ratio of the valve based on data produced by the first sensor and the second sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography method, comprising:
   transmitting a main pulse laser to a zone of excitation through a first optic assembly, wherein the first optic assembly comprises a mounted portion and a mirror in contact with the mounted portion;
   supplying a first coolant to the mounted portion and a second coolant to the mirror, respectively;
   detecting a temperature of the first coolant and a temperature of the second coolant;
   transmitting data in relation to the temperature of the first coolant to a first processor and data in relation to the temperature of the second coolant to a second processor separated from the first processor;
   controlling a flow rate of the first coolant passing through the mounted portion of the first optic assembly by adjusting an open ratio of a first valve, wherein the open ratio of the first valve gradually increases in a first period of time and is fixed in a second period of time after the end of the first period of time, wherein the first period of time is determined according to historical data relating to a temperature of the mounted portion in one or more previously conducted processes;
   controlling a flow rate of the second coolant passing through the mirror by adjusting an open ratio of a second valve separated from the first valve;
   generating a droplet of a target material in the zone of excitation; and
   exciting the droplet of the target material into plasma with the main pulse laser in the zone of excitation.

2. The lithography method of claim 1, further comprising:
   detecting a temperature of the first coolant with a use of at least one sensor,
   wherein an increasing rate of the open ratio of the first valve in the first period of time is determined based on the temperature of the first coolant.

3. The lithography method of claim 1, further comprising:
   detecting a temperature of the first coolant with a use of at least one sensor,
   wherein the open ratio of the first valve in the second period of time is determined based on the temperature of the first coolant detected in the end of the first period of time.

4. The lithography method of claim 1, wherein the first period of time is in a range from about 0.5 hours to about 4 hours.

5. The lithography method of claim 1, wherein the end of the first period of time is set when an average temperature of the first optic assembly reaches a predetermined value.

6. The lithography method of claim 1, further comprising:
transmitting a pre-pulse laser to the zone of excitation through a second optic assembly; and
hitting the droplet of the target material with the pre-pulse laser before its excitation by the main pulse laser,
wherein the main pulse laser and the pre-pulse laser are diverged at the second optic assembly, and the main pulse laser is reflected by the second optic assembly to the first optic assembly.

7. The lithography method of claim 1, wherein the plasma emits an extreme ultraviolet light having a wavelength in a range from about 1 nm to about 100 nm.

8. The lithography method of claim 1, further comprising:
performing a closed loop control of the first valve and the second valve by a controller module according to the data in relation to the temperature of the first coolant and the data in relation to the temperature of the second coolant.

9. A lithography method, comprising:
emitting a pre-pulse laser and a main pulse laser by a laser generator;
directing the pre-pulse laser and the main pulse laser to a zone of excitation through a first optic assembly, wherein the first optic assembly comprises a mounted portion and a mirror over the mounted portion;
supplying a first coolant to the mounted portion and a second coolant to the mirror;
detecting a flow rate of the first coolant and a flow rate of the second coolant;
transmitting data in relation to the flow rate of the first coolant to a first processor and data in relation to the flow rate of the second coolant to a second processor separated from the first processor;
controlling the flow rate of the first coolant passing through the mounted portion by adjusting an open ratio of a first valve, wherein the open ratio of the first valve increases in a first period of time and is fixed in a second period of time after the end of the first period of time;
generating a droplet of a target material in the zone of excitation; and
converting the droplet into plasma by the pre-pulse laser and the main pulse laser in the zone of excitation.

10. The lithography method of claim 9, wherein the open ratio of the first valve is partially open after the end of the first period of time.

11. The lithography method of claim 9, wherein the open ratio of the first valve is fully open after the end of the first period of time.

12. The lithography method of claim 9, wherein the first period of time is determined based on a historical data relating to a temperature of the mounted portion in one or more previously conducted processes.

13. The lithography method of claim 9, wherein the flow rate of the second coolant is controlled by a second valve separated from the first valve.

14. The lithography method of claim 13, further comprising:
performing a closed loop control of the first valve and the second valve by a controller module according to the data in relation to the flow rate of the first coolant and the data in relation to the flow rate of the second coolant.

15. The lithography method of claim 9, wherein the pre-pulse laser and the main pulse laser are separated by the first optic assembly.

16. A lithography system, comprising:
a main pulse laser source configured to generate a main pulse laser;
an optic assembly comprising an optic and configured to transmit the main pulse laser to a zone of excitation, wherein the optic assembly comprises a mounted portion and a mirror over the mounted portion;
a coolant supplying module connected to the optic assembly and comprises a first valve for controlling a flow rate of a first coolant supplied into the mounted portion of the optic assembly and a second valve for controlling a flow rate of a second coolant supplied into the mirror of the optic assembly;
a first sensor and a second sensor configured to produce data in relation to the flow rate of the first coolant and data in relation to the flow rate of the second coolant, respectively;
a controller module electrically connected to the first valve and configured to control an open ratio of the first valve according to the data in relation to the flow rate of the first coolant, wherein the open ratio of the first valve gradually increases in a first period of time and is fixed in a second period of time after an end of the first period of time;
a first processor and a second processor electrically connecting the first sensor and the second sensor to the controller module, respectively, wherein the first processor is configured to transfer the data in relation to the flow rate of the first coolant to the controller module, and the second processor is configured to transfer the data in relation to the flow rate of the second coolant to the controller module; and
a droplet generator configured to generate a droplet of target material in the zone of excitation.

17. The lithography system of claim 16, wherein the first sensor is configured to produce data in relation to a temperature of the first coolant, wherein the open ratio of the first valve at the second period of time is determined based on the temperature of the first coolant detected in the end of the first period of time.

18. The lithography system of claim 16, wherein the controller module is configured to perform a closed loop control of the first valve and the second valve according to the data in relation to the flow rate of the first coolant and the data in relation to the flow rate of the second coolant.

19. The lithography system of claim 16, further comprising:
an inlet conduit connected to the mounted portion of the optic assembly, wherein the first sensor is connected to the inlet conduit;
an outlet conduit connected to the mounted portion of the optic assembly; and
a third sensor connected to the outlet conduit, wherein the first sensor is configured to detect a first temperature of the first coolant in the inlet conduit, the third sensor is configured to detect a second temperature of the first coolant in the out conduit, and the first processor is configured to calculate a temperature difference between the first temperature and the second temperature, and wherein the temperature difference is transferred to the controller module.

20. The lithography system of claim 19, wherein the controller module is configured to control the open ratio of the first valve according to the temperature difference.

* * * * *